(12) United States Patent
Kudoh et al.

(10) Patent No.: US 8,114,706 B2
(45) Date of Patent: Feb. 14, 2012

(54) SELECTIVE REMOVAL OF GOLD FROM A LEAD FRAME

(75) Inventors: Takahiko Kudoh, Beppu (JP); Muhammad Faisal Khan, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/095,536

(22) Filed: Apr. 27, 2011

(65) Prior Publication Data
US 2011/0201158 A1 Aug. 18, 2011

Related U.S. Application Data

(62) Division of application No. 11/464,767, filed on Aug. 15, 2006, now Pat. No. 7,956,445.

(51) Int. Cl.
H01L 21/50 (2006.01)
H01L 21/48 (2006.01)
H01L 21/44 (2006.01)

(52) U.S. Cl. ........ 438/106; 438/118; 438/123; 438/617; 257/666; 257/673; 257/E21.641

(58) Field of Classification Search ................ None
See application file for complete search history.

(56) References Cited

U.S. PATENT DOCUMENTS

| | | | |
|---|---|---|---|
| 5,013,688 A | 5/1991 | Yamazaki et al. | |
| 5,166,097 A | 11/1992 | Tanielian | |
| 5,914,532 A | 6/1999 | Akagi et al. | |
| 5,929,511 A | 7/1999 | Nakazawa et al. | |
| 6,194,777 B1 | 2/2001 | Abbott et al. | |
| 6,773,961 B1 * | 8/2004 | Lee et al. | 438/112 |
| 2006/0125062 A1 | 6/2006 | Zuniga-Ortiz et al. | |

* cited by examiner

*Primary Examiner* — Zandra Smith
*Assistant Examiner* — Khanh Duong
(74) *Attorney, Agent, or Firm* — Steven A. Shaw; W. James Brady; Frederick J. Telecky, Jr.

(57) ABSTRACT

A method of packaging an integrated circuit, including providing a lead frame having lead fingers, where the lead frame has a gold layer thereon on a top surface and a bottom surface. An integrated circuit die is attached to the lead frame. The gold layer is substantially removed from portions of the top surface of the lead frame. The integrated circuit die is wire bonded to the lead fingers with a plurality of wire stitches subsequent to substantially removing the gold. The die is encapsulated in a mold compound to form a packaged integrated circuit.

20 Claims, 3 Drawing Sheets

SELECTIVE REMOVAL OF GOLD FROM A LEAD FRAME

This is a divisional of application Ser. No. 11/464,767 filed Aug. 15, 2006, the contents of which are herein incorporated by reference in its entirety.

TECHNICAL FIELD OF THE INVENTION

The invention is directed, in general, to integrated circuit packaging, and, more specifically, to a method of improving adhesion of mold compound to a lead frame.

BACKGROUND OF THE INVENTION

Integrated circuits are typically produced using a semiconductor wafer on which multiple copies, or die, of the circuit are simultaneously fabricated. After fabrication, the die are tested and separated in preparation for packaging. The functional die are attached to a lead frame having positions for several die. The die is electrically connected to the lead frame by wire bonding, and encapsulated with a mold compound. The packaged die are then separated from the lead frame and may be tested prior to shipment.

The lead frame metallization may include electroplated nickel (Ni) and palladium (Pd). A gold layer is typically electroplated over the palladium layer to improve the wetting of solder to the leads when the packaged die is mounted to a circuit board. The gold is typically formed on all exposed palladium surfaces of the lead frame.

The described manufacturing protocol results in packaged integrated circuits that have a favorable reliability record. However, a number of packaged die failures may still occur due to imperfect adhesion of the mold compound to the lead frame that allows ingress of moisture into the package. Such failures may result in lower packaging yield or may even occur in a customer installation.

Accordingly, what is needed in the art is an improved method of packaging that reduces the failure rate of packaged integrated circuits.

SUMMARY OF THE INVENTION

To address the above-discussed deficiencies of the prior art, the invention provides a method of packaging an integrated circuit. An integrated circuit (IC) die is attached to a lead frame having lead fingers, with the lead frame having a top surface and a bottom surface and an outermost gold layer thereon. The outermost gold layer is substantially removed from a portion of the top surface of the lead frame. At least one wire stitch is used to wire bond the integrated circuit die to the lead fingers subsequent to substantially removing the gold. The die and wire bonds are encapsulated in a mold compound to form a packaged integrated circuit.

Another embodiment is a packaged integrated circuit including at least a portion of a lead frame having a lead finger. The lead frame has a top metallization and a bottom metallization, with the bottom metallization having an outermost layer of gold located thereon. An integrated circuit die is affixed to the lead frame portion. The lead fingers have an outermost wire bonding surface that is substantially free of gold. A wire bond connects the die to a lead finger, and mold compound encapsulates the die and wire bond.

Another embodiment is a packaged integrated circuit. The packaged circuit is formed by the process of providing a lead frame with a top and a bottom surface. The top and bottom surfaces have a gold layer thereon, and the lead frame includes a lead finger. An integrated circuit die is attached over the top surface, and is wire bonded to the lead finger. The die is encapsulated in a mold compound to form a packaged integrated circuit. The gold on the top surface is substantially removed prior to wire bonding.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
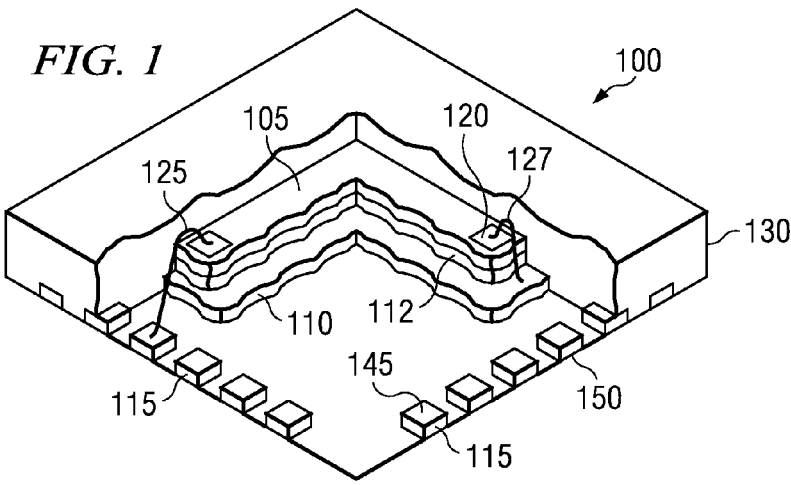
FIG. 1 illustrates a packaged integrated circuit.

FIG. 1 illustrates a packaged integrated circuit (IC) 100 manufactured according to the invention. Without limitation, a Quad Flat No-lead (QFN) package is shown as an example. While the following description assumes the use of a QFN package, those skilled in the packaging arts will recognize that the invention may be practiced with numerous package types. The packaged IC 100 includes an IC die 105 mounted to a die pad 110 with adhesive 112, and lead fingers 115. Bond pads 120 on the IC die 105 may be connected to the lead fingers 115 by fine wire stitches 125. In the following discussion, it is assumed that gold wire is used, though in some cases, other materials such as copper and aluminum may be used. In addition to the lead fingers 115, a bond pad 120 may be connected to the die pad 110 by a down bond 127. The IC die 105, stitches 125 and a portion of the lead fingers 115 are encapsulated by a mold compound 130.

The lead fingers 115 and die pad 110 have a top surface 145 and a bottom surface 150. As described further below, the bottom surface 150 may have an outermost layer of gold to improve wetting of solder thereto when the packaged IC 100 is mounted to a circuit assembly at a later stage of manufacturing. In contrast, as discussed below, portions of the top surface 145 are substantially free of gold.

Figure 2:
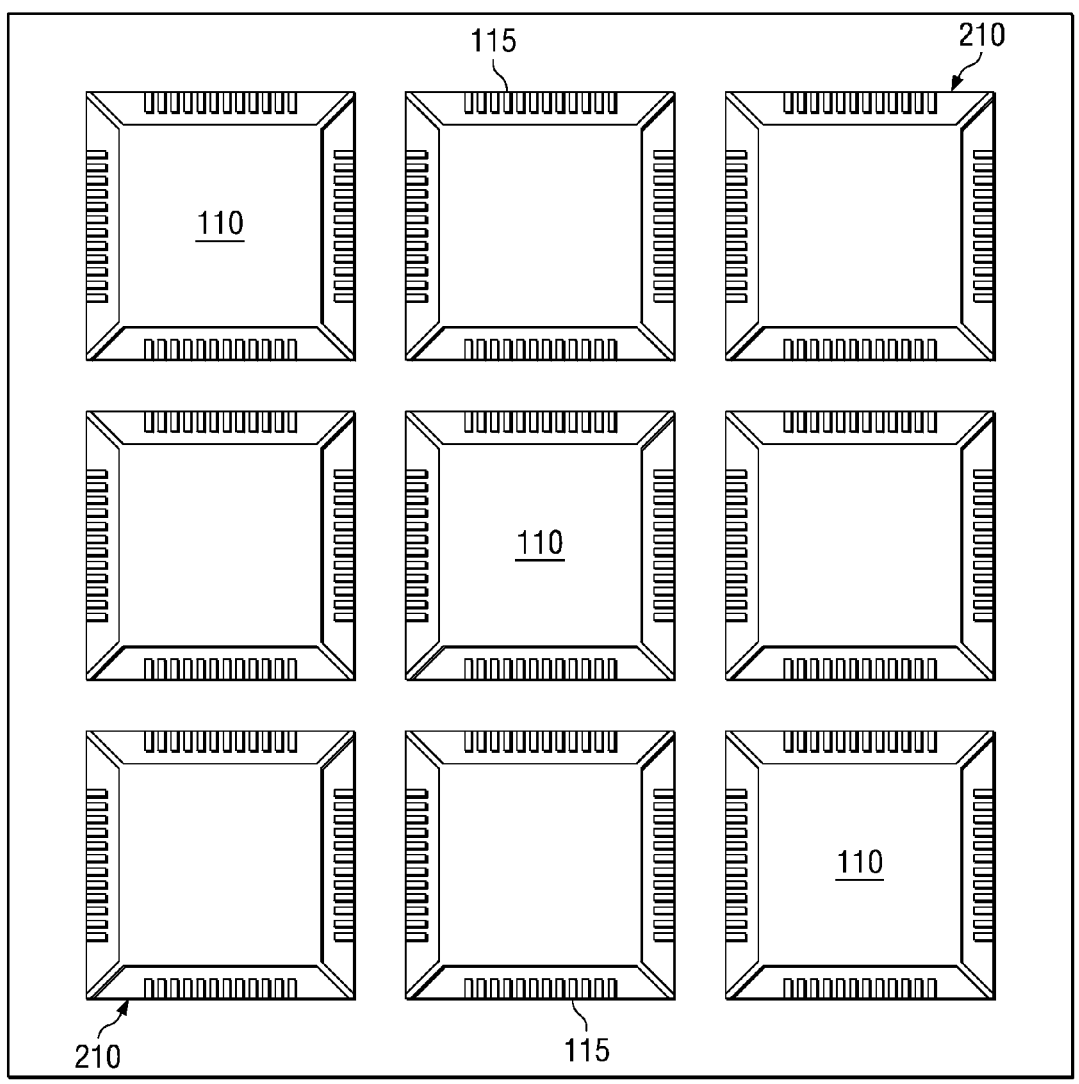
FIG. 2 illustrates a lead frame.

FIG. 2 illustrates an example of a lead frame 200. The lead frame 200 may be received from a manufacturer with an outermost layer of gold formed thereon. For reasons discussed below, the gold on a top surface of the lead frame 200 is substantially removed prior to forming the wire stitches 125. The lead frame 200 includes a plurality of individual lead assemblies 210, which each include a die pad 110 and at least one lead finger 115. The IC die 105 is typically attached to the die pad 110 prior to wire bonding. After wire bonding, the assembly including the IC die 105, the lead assembly 210, and stitches 125 is encapsulated using the mold compound 130 to form the packaged IC 100 and separated from other packaged ICs 100 formed on the same lead frame 200.

Figure 3A:
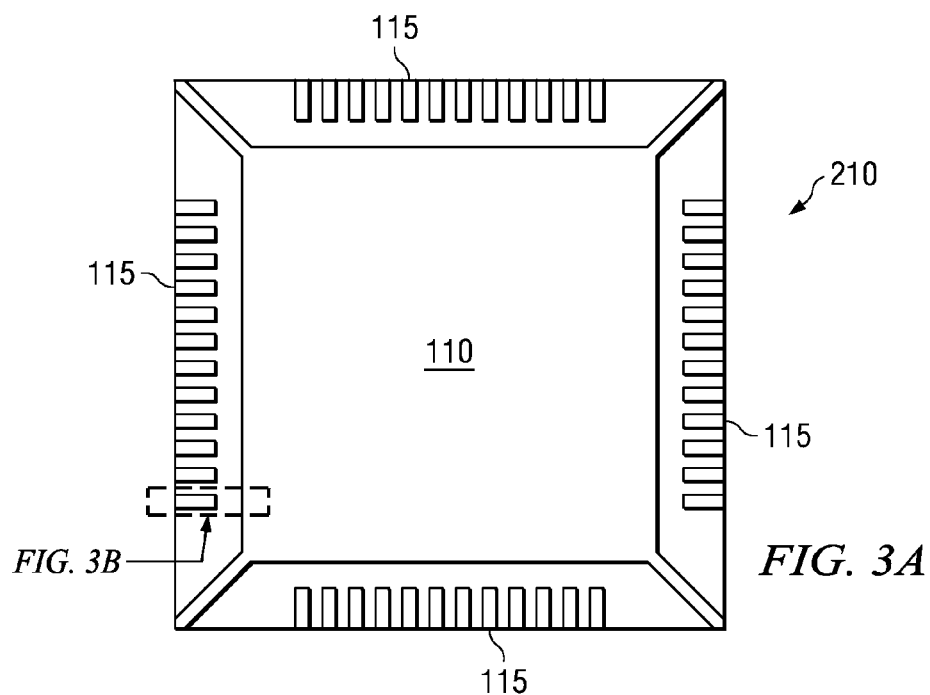
FIG. 3 illustrates a portion of a lead frame.
Figure 3B:
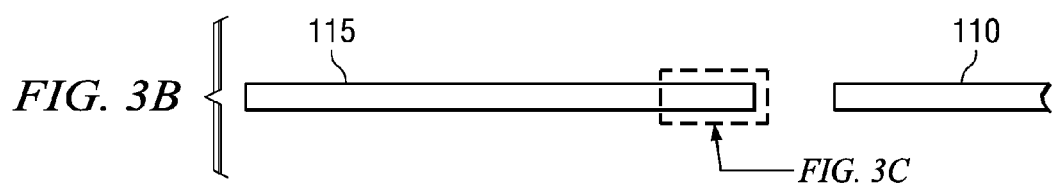
Figure 3C:
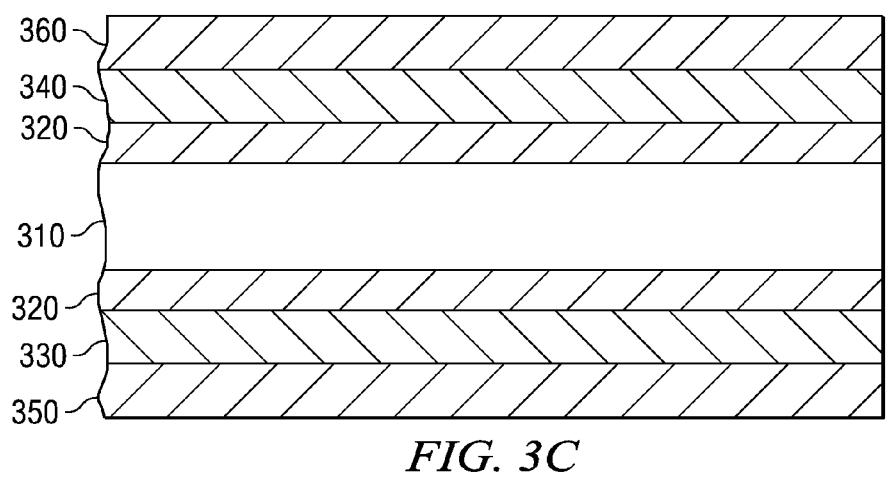

FIG. 3A illustrates a single lead assembly 210 in greater detail prior to processing to remove gold therefrom. FIG. 3B illustrates a sectional view of a single lead finger 115. The lead finger 115 is typically coplanar with the die pad 110. FIG. 3C illustrates a sectional view of the lead finger 115. The lead finger 115 includes a core 310. The core 310 may be a currently existing conventional material, such as copper, copper/beryllium alloy, or phosphor bronze, or may be a future-discovered material.

A nickel layer 320 may be formed over the core 310, and palladium layers 330, 340 may be formed thereover. An outermost layer of gold 350 overlies the palladium layer 330 on the bottom surface 150 of the lead finger 115. The gold layer 350 is believed to improve wetting of solder to an exposed portion of the lead finger 115 when the packaged IC 100 is mounted to a circuit board in a later stage of manufacturing. An outermost layer of gold 360 overlies the palladium layer 340 on the top surface 145 of the lead finger 115. A described below, however, the gold layer 360 is substantially removed prior to formation of the wire stitches 125.

The Applicants have discovered that the adhesion of some mold compounds is greater to palladium than to gold. If the adhesion is not adequate, the mold compound may delaminate from a lead finger 115 or the die pad 110. When delamination occurs, environmental moisture may find ingress into the package. The resulting proximity of moisture to the IC die 105 may lead to early failure thereof.

Thus, one method of increasing adhesion of the mold compound 130 to the lead finger 115 might be to eliminate the gold layers 350, 360 from the lead finger 115. However, this would remove the aforementioned advantageous solder wetting properties of the gold layer 350. An alternative might be to mask the top surface 145 of the lead frame 200 to prevent deposition of the gold layer 360 while allowing deposition of the gold layer 350 when the lead frame 200 is manufactured. However a masking process may not be possible without adding unacceptable cost to the packaged IC 100 in a highly competitive industry.

An embodiment of the invention provides for the economical and substantial removal of the gold layer 360 from the lead finger 115, and in one aspect of this embodiment, the gold layer 360 is substantially removed while retaining the benefit of the gold layer 350. In this particular embodiment, a plasma process is used to result in the substantially complete removal of the gold layer 360. The mold compound 130 may then directly contact the palladium layer 340, and adhesion to the lead finger 115 may be increased. This increase may then result in a reduction of the failure rate of the packaged IC 100.

Figure 4:
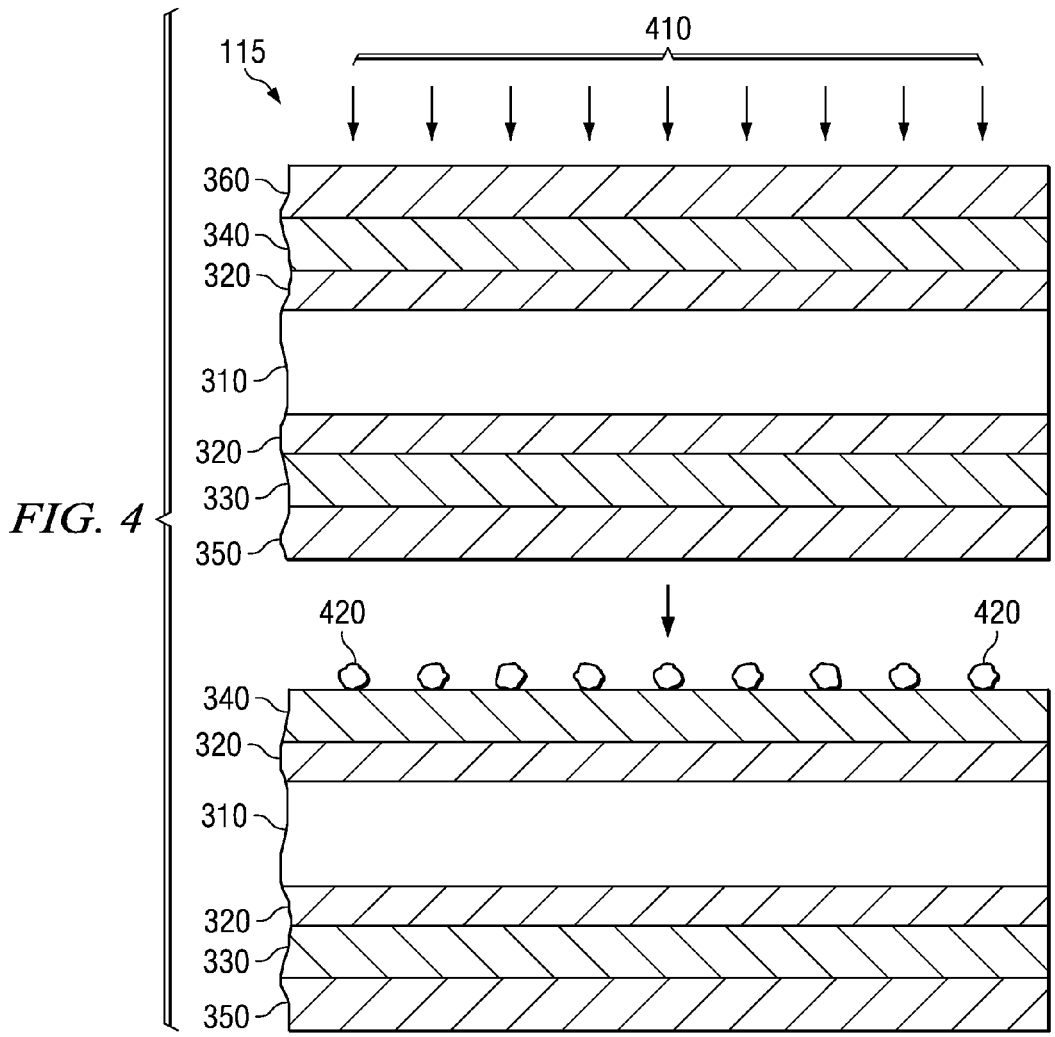
FIG. 4 illustrates a process that substantially removes an outermost gold layer.

FIG. 4 illustrates a process 410 designed to substantially remove the gold layer 360. As used herein, "substantially remove" is defined as removing a sufficient portion of the gold layer 360 such that a wire stitch 125 to the top surface 145 forms an intermetallic region including metal from the wire stitch 125 and palladium from the palladium layer 340. Similarly, with respect to a wire bonding surface, the surface is "substantially free" of the gold layer 360 when such an intermetallic layer may be formed or when only trace amounts 420 of the gold layer 360 remain.

Portions of the top surface 145 of the die pad 110 not protected by the IC die 105 are also exposed to the process 410. Because down bonds 127 may be formed to the die pad 110, the exposed portions of the die pad 110 may be regarded as bonding surfaces in addition to the lead fingers 115. The process 410 is expected to remove the gold layer 360 from such portions in a substantially similar manner as for the lead fingers 115. Throughout this description, it is assumed that this is so even without explicit reference to the die pad 110.

The IC die 105 acts to substantially block the process 410 from removing the gold layer 360 under the IC die 105. Thus, the gold layer 360 will remain substantially unaltered from the condition thereof when the IC die 105 is attached to the die pad 110.

The process 410 may be designed to remove the gold layer 360 at a minimum rate high enough to result in acceptable process throughput. Further, the process may be designed to remove the gold layer 360 at a maximum rate, above which the process would not be easily controllable. Contamination present on a surface of the IC die 105 may also be removed by the process 410. The etch gas may include a noble gas such as Ar, or may include $O_2$ or $N_2$. A bias voltage may optionally be used.

An example of a process 410 is provided below, while recognizing that details of such a process may depend on the thickness of the gold layer 360 and on the etch tool used to implement the process. Using a Panasonic PCX-303 etch tool, an Ar plasma may be used with a pressure of about 20 Pa and 600 W power without bias. Under these conditions, a removal rate of about 35 nm/min results, and a process time ranging from about 20 s to about 25 s is sufficient to substantially remove a gold layer 360 with a thickness of about 3-12 nm. Those skilled in the pertinent art may determine specific process parameters based on the characteristics of the etch tool and the thickness of the gold layer 360.

Without limitation, an example is provided to illustrate the improved adhesion between the mold compound 130 and the lead fingers 115 and die pad 110 resulting from use of the process 410. A package qualification test was conducted per JEDEC standard J-STD-020C using 24 IC die individually assembled in QFN packages. The J-STD-020C standard sets forth moisture sensitivity levels (MSLs) that specify a minimum lifetime of a packaged part at 30° C./60% RH. A lower MSL indicates a longer period of time for which a package may be stored at these conditions. The standard provides an accelerated soak condition for each MSL to demonstrate survival for the minimum time specified by that MSL. Without removing the gold layer 360, all of a first group of twelve packages suffered delamination of the mold compound from the die pad 110 when tested at Level 2 soak conditions of 168 hours at 85° C./60% RH. In contrast, all of a second group of twelve packages assembled using the process 410 survived the Level 2 soak conditions without failure. Thus, substantial removal of the gold layer 360 from the lead fingers 115 and die pad 110 may increase (improve) the MSL by at least one rank.

In another embodiment, the gold layer 360 may be partially or substantially removed prior to attaching the IC die 105 to the lead frame 200. Additional gold may then be removed from the top surface 145 after the IC die 105 is attached to the die pad 110. When the gold layer 360 is removed in this manner, the time that the IC die 105 is exposed to plasma is reduced relative to removal entirely after the die 105 is attached. The lower exposure time may be advantageous for certain IC devices having particularly sensitive circuits or a thin passivation overcoat (PO) on the IC die 105.

Substantial removal of the gold layer 360 may also improve the connection strength of the stitches 125 between the bond pad 120 and the lead finger 115. A wire connection may be characterized as having a ball end and a stitch end. The ball end is generally attached to the bond pad 120, and the stitch end is generally attached to the lead finger 115. When a stitch end is formed, heat and ultrasonic energy act to form an intermetallic region including metal from the stitch 125 and metal from the top surface 145. It is believed that when the gold layer 360 is substantially removed, the stitch forms an intermetallic region including the palladium layer 340, and the strength of the wire connection is increased relative to a stitch made to the gold layer 360.

Figure 5:
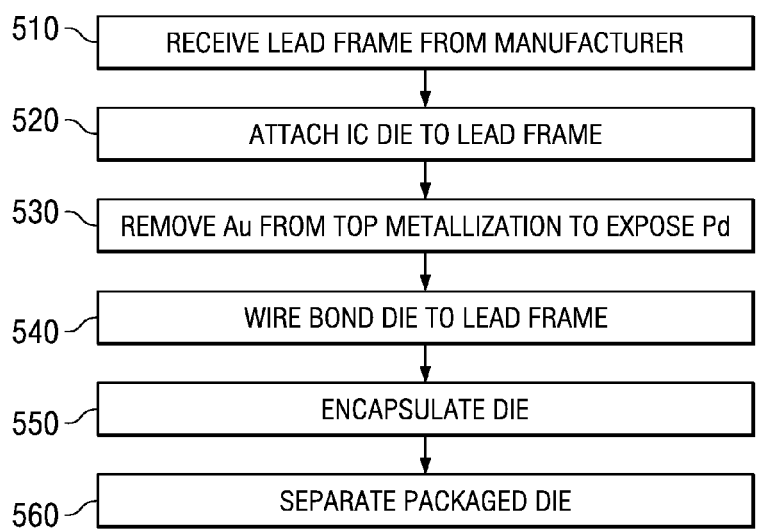
FIG. 5 illustrates an embodiment of a method of manufacturing an integrated circuit.

FIG. 5 illustrates an embodiment of a method of manufacturing an integrated circuit in which an outermost layer of gold is removed from a top surface of a lead frame. In a step 510, a lead frame is received from a manufacturer. The lead frame is received with an outermost layer of gold on a top and bottom surface, and a layer of palladium thereunder. In a step

520, an IC die is attached to a die pad of the lead frame by a suitable means such as epoxy adhesive. In a step 530, the gold is substantially removed from a portion of the top surface of the lead frame. Optionally, the removal may be performed prior to or after the IC die is attached to the lead frame. In another option, the gold may be partially removed before the IC die is attached to the lead frame, and substantially removed thereafter. The gold may be removed using a plasma process as previously described.

In a step 540, electrical connections from the IC die to lead fingers are made. Such connections may be made, e.g., by gold wire bonding. In a step 550, the IC die and gold wires are encapsulated in a mold compound. In a step 560 the encapsulated IC die and lead fingers are separated from the lead frame.

Those skilled in the art to which the invention relates will appreciate that other and further additions, deletions, substitutions and modifications may be made to the described embodiments without departing from the scope of the invention.

What is claimed is:

1. A method of packaging an integrated circuit, comprising:
    affixing an integrated circuit die to a top surface of a lead frame, which includes a gold plated die pad and gold plated lead fingers; and
    using the affixed integrated circuit die as mask, substantially removing gold from unmasked portions of the top surface of the lead frame.

2. The method as recited in claim 1, wherein the removing is by using a plasma process.

3. The method as recited in claim 2, wherein said plasma process includes plasma Ar.

4. The method as recited in claim 3, wherein said plasma process includes plasma oxygen or nitrogen or both.

5. The method as recited in claim 1, wherein removing gold exposes a palladium surface.

6. The method as recited in claim 5, further comprising wire-bonding the integrated circuit die to the palladium surface.

7. The method as recited in claim 6, in which the wire-bonding uses bond wire including gold.

8. The method as recited in claim 6, in which the wire-bonding uses bond wire including copper.

9. The method as recited in claim 1, further comprising shielding plated gold on a bottom surface from being removed at the removing step.

10. The method as recited in claim 1, in which the lead frame has a core layer including copper.

11. A method of packaging an integrated circuit, comprising:
    providing a lead frame having a die pad and lead fingers plated with gold of a first thickness on a top surface and a bottom surface;
    removing a portion of the gold from the top surface of the lead frame so that the gold on the top surface is less than the first thickness;
    affixing an integrated circuit die to the top surface of a lead frame over the die pad;
    using the affixed integrated circuit die as mask, substantially removing the remaining gold from unmasked portions of the top surface of the lead frame.

12. The method as recited in claim 11, wherein the removing is by using a plasma process.

13. The method as recited in claim 12, wherein said plasma process includes plasma Ar.

14. The method as recited in claim 13, wherein said plasma process includes plasma oxygen or plasma nitrogen or both.

15. The method as recited in claim 11, wherein removing gold exposes a palladium surface.

16. The method as recited in claim 15, further comprising wire-bonding the integrated circuit die to the palladium surface.

17. The method as recited in claim 16, in which the wire-bonding uses bond wire including gold.

18. The method as recited in claim 16, in which the wire-bonding uses bond wire including copper.

19. The method as recited in claim 11, further comprising shielding plated gold on a bottom surface from being removed at the removing steps.

20. The method as recited in claim 11, in which the lead frame has a core layer including copper.

* * * * *